(12) United States Patent
Pham

(10) Patent No.: US 11,744,021 B2
(45) Date of Patent: Aug. 29, 2023

(54) ELECTRONIC ASSEMBLY

(71) Applicant: Analog Devices, Inc., Wilmington, MA (US)

(72) Inventor: Hien Minh Pham, Wilmington, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/581,824

(22) Filed: Jan. 21, 2022

(65) Prior Publication Data
US 2023/0240011 A1    Jul. 27, 2023

(51) Int. Cl.
*H05K 1/11* (2006.01)
*H05K 1/18* (2006.01)
*H05K 3/30* (2006.01)

(52) U.S. Cl.
CPC ............ *H05K 1/181* (2013.01); *H05K 1/115* (2013.01); *H05K 3/303* (2013.01); *H05K 2201/10515* (2013.01); *H05K 2201/10545* (2013.01); *H05K 2201/10954* (2013.01)

(58) Field of Classification Search
CPC ......... H05K 1/115; H05K 2201/10515; H05K 2201/10954; H05K 3/303; H05K 1/181
See application file for complete search history.

(56) References Cited

U.S. PATENT DOCUMENTS

| | | |
|---|---|---|
| 4,801,912 A | 1/1989 | McElheny et al. |
| 4,841,101 A | 6/1989 | Pollock |
| 5,223,672 A | 6/1993 | Pinneo et al. |
| 5,432,482 A | 7/1995 | Bailey |
| 5,523,622 A | 6/1996 | Harada et al. |
| 5,760,650 A | 6/1998 | Faulkner et al. |
| 5,783,870 A | 7/1998 | Mostafazadeh et al. |
| 5,790,005 A | 8/1998 | Santi et al. |
| 5,819,401 A | 10/1998 | Johannes et al. |
| 5,932,927 A | 8/1999 | Koizumi et al. |

(Continued)

FOREIGN PATENT DOCUMENTS

| | | |
|---|---|---|
| CN | 106787905 | 5/2017 |
| DE | 202014104574 | 11/2014 |

(Continued)

OTHER PUBLICATIONS

Dang et al., "Permanent Magnet Coupled Power Inductor for Multi-Phase DC-DC Power Converters", IEEE Transactions on Industrial Electronics 2016, DOI: 10.1109/TIE.2016.2626364, in 10 pages.

(Continued)

*Primary Examiner* — Sherman Ng
(74) *Attorney, Agent, or Firm* — Knobbe, Martens, Olson & Bear, LLP

(57) ABSTRACT

In one embodiment, an electronic assembly can include: a first electronic device package configured to be mounted on and electrically connected with a system substrate; a second electronic device package electrically connected to the system substrate; and an electrical pathway configured to extend from the system substrate through the first electronic device package and connected to an input terminal of the second electronic device package, the electrical pathway bypassing processing circuitry of the first electronic device package.

17 Claims, 12 Drawing Sheets

(56) References Cited

U.S. PATENT DOCUMENTS

| | | |
|---|---|---|
| 5,994,975 A | 11/1999 | Allen et al. |
| 6,008,530 A | 12/1999 | Kano |
| 6,111,198 A | 8/2000 | Tower |
| 6,415,504 B1 | 7/2002 | Matsuda |
| 6,423,575 B1 | 7/2002 | Tran et al. |
| 6,455,880 B1 | 9/2002 | Ono et al. |
| 6,514,783 B1 | 2/2003 | Welstand |
| 6,680,544 B2 | 1/2004 | Lu et al. |
| 6,841,731 B1 | 1/2005 | Zanello |
| 6,844,502 B2 | 1/2005 | Deng et al. |
| 6,900,533 B2 | 5/2005 | Burton |
| 7,045,386 B2 | 5/2006 | Hikita et al. |
| 7,412,172 B2 | 8/2008 | Kuchta et al. |
| 7,444,734 B2 | 11/2008 | Gaucher et al. |
| 7,528,475 B2 | 5/2009 | Go et al. |
| 7,569,918 B2 | 8/2009 | Gerber et al. |
| 7,642,635 B2 | 1/2010 | Kikuchi et al. |
| 7,732,913 B2 | 9/2010 | Hsieh et al. |
| 7,968,978 B2 | 6/2011 | Adlerstein et al. |
| 7,994,622 B2 | 8/2011 | Mohammed et al. |
| 8,119,931 B1 | 2/2012 | Liu |
| 8,153,449 B2 | 4/2012 | Adlerstein et al. |
| 8,487,604 B2 | 7/2013 | Ikriannikov et al. |
| 8,618,629 B2 | 12/2013 | Kim et al. |
| 8,623,700 B1 | 1/2014 | Bernstein et al. |
| 8,638,187 B2 | 1/2014 | Ikriannikov |
| 8,773,204 B2 | 7/2014 | Cabanillas et al. |
| 8,779,885 B2 | 7/2014 | Li et al. |
| 9,048,232 B2 | 6/2015 | Colussi et al. |
| 9,059,490 B2 | 6/2015 | DeVries et al. |
| 9,184,117 B2 | 11/2015 | Ho et al. |
| 9,245,835 B1 | 1/2016 | Jiang et al. |
| 9,252,665 B2 | 2/2016 | Hashino et al. |
| 9,318,450 B1 | 4/2016 | Reza et al. |
| 9,437,558 B2 | 9/2016 | Pye et al. |
| 9,559,043 B2 | 1/2017 | Ye |
| 9,577,416 B2 | 2/2017 | Nisslbeck et al. |
| 9,666,544 B2 | 5/2017 | Zu et al. |
| 9,711,465 B2 | 7/2017 | Liao et al. |
| 9,812,379 B1 | 11/2017 | Chiu et al. |
| 9,978,698 B1 | 5/2018 | Trulli et al. |
| 10,325,715 B2 | 6/2019 | Knoll et al. |
| 10,325,742 B2 | 6/2019 | Koul et al. |
| 10,665,579 B2 * | 5/2020 | Trimberger ............ H01L 24/17 |
| 10,872,816 B2 | 12/2020 | Hollis |
| 10,945,337 B2 | 3/2021 | Ikeda et al. |
| 10,958,182 B2 | 3/2021 | Ji et al. |
| 11,017,937 B2 | 5/2021 | Hsieh et al. |
| 11,049,638 B2 | 6/2021 | Hanson et al. |
| 11,350,537 B2 | 5/2022 | Winter et al. |
| 11,417,615 B2 | 8/2022 | Lin |
| 11,424,196 B2 | 8/2022 | Mahon et al. |
| 2002/0089069 A1 | 7/2002 | Lamson et al. |
| 2003/0053286 A1 | 3/2003 | Masuda et al. |
| 2003/0080822 A1 | 5/2003 | Tzsuang et al. |
| 2004/0173370 A1 | 9/2004 | Deng et al. |
| 2004/0227583 A1 | 11/2004 | Shaffner et al. |
| 2008/0023814 A1 | 1/2008 | Yang |
| 2008/0100394 A1 | 5/2008 | Margomenos et al. |
| 2009/0057872 A1 | 3/2009 | Ehlers et al. |
| 2009/0102740 A1 | 4/2009 | Rofougaran |
| 2010/0200968 A1 | 8/2010 | Purden et al. |
| 2010/0232480 A1 | 9/2010 | Bhandal et al. |
| 2010/0321129 A1 | 12/2010 | Onody et al. |
| 2011/0084358 A1 | 4/2011 | Kim et al. |
| 2011/0223692 A1 | 9/2011 | Adlerstein et al. |
| 2011/0228507 A1 | 9/2011 | Yin et al. |
| 2012/0049994 A1 | 3/2012 | Joo et al. |
| 2012/0062332 A1 | 3/2012 | Nagai et al. |
| 2012/0193771 A1 | 8/2012 | Masuda |
| 2013/0015467 A1 | 1/2013 | Krumbein et al. |
| 2013/0256849 A1 | 10/2013 | Danny et al. |
| 2013/0256850 A1 | 10/2013 | Danny et al. |
| 2014/0118084 A1 | 5/2014 | Takemura |
| 2014/0251670 A1 | 9/2014 | Sakai et al. |
| 2014/0300003 A1 | 10/2014 | Kariyazaki et al. |
| 2015/0042417 A1 | 2/2015 | Onodera et al. |
| 2015/0097633 A1 | 4/2015 | DeVries et al. |
| 2015/0255360 A1 | 9/2015 | Hsu |
| 2016/0064792 A1 | 3/2016 | Qiang et al. |
| 2016/0088754 A1 | 3/2016 | Francis |
| 2016/0124478 A1 | 5/2016 | Beeston et al. |
| 2016/0126920 A1 | 5/2016 | Kaper |
| 2016/0181211 A1 | 6/2016 | Kamgaing et al. |
| 2016/0343653 A1 | 11/2016 | Huang et al. |
| 2016/0344084 A1 | 11/2016 | Ghassemi et al. |
| 2017/0048969 A1 | 2/2017 | Qiang et al. |
| 2017/0077896 A1 | 3/2017 | Sugaya et al. |
| 2017/0111078 A1 | 4/2017 | Onodera et al. |
| 2017/0179050 A1 | 6/2017 | Kariyazaki |
| 2017/0236803 A1* | 8/2017 | Zaal ................. H01L 25/0657 29/841 |
| 2017/0268827 A1 | 9/2017 | Kaminski et al. |
| 2018/0012834 A1 | 1/2018 | Wang et al. |
| 2018/0034421 A1 | 2/2018 | Abdo et al. |
| 2018/0122747 A1 | 5/2018 | Sun et al. |
| 2018/0358675 A1 | 12/2018 | Laighton et al. |
| 2019/0267361 A1 | 8/2019 | Rahim et al. |
| 2019/0295966 A1 | 9/2019 | Kong |
| 2019/0333899 A1 | 10/2019 | Eom et al. |
| 2019/0371746 A1 | 12/2019 | Mahon et al. |
| 2019/0371747 A1 | 12/2019 | Wilcox |
| 2020/0075490 A1 | 3/2020 | Sung et al. |
| 2020/0168567 A1 | 5/2020 | Lin |
| 2020/0212914 A1 | 7/2020 | Lee et al. |
| 2020/0375049 A1 | 11/2020 | Winter et al. |
| 2022/0255249 A1 | 8/2022 | Kikuta |

FOREIGN PATENT DOCUMENTS

| | | |
|---|---|---|
| JP | 59-155154 | 9/1984 |
| JP | 2010-267816 | 11/2010 |
| KR | 10-2006-0015919 | 2/2006 |

OTHER PUBLICATIONS

Alléaume et al., "Millimetre-wave hot-via interconnect-based GaAs chip-set for automotive Radar and security sensors," Proceedings of the 3rd European Microwave Integrated Circuits Conference, Oct. 2008, Amsterdam, The Netherlands, pp. 52-55.

Bessemoulin et al., "A chip-scale packaged amplifier MMIC using broadband hot-via-transitions," 11th GAAS Symposium, Munich 2003, pp. 415-418.

Bessemoulin, "Design data for hot-via interconnects in chip scale packaged MMICs up to 110 GHz," 12th GAAS Symposium, Amsterdam 2004, pp. 495-498.

Bessemoulin et al., "Hot-via interconnects: A step toward surface mount chip scale packaged MMICs up to 110 GHz," IEEE CSIC Digest, 2004, pp. 237-240.

Bessemoulin et al., "Soldered hot-via E-band and W-band power amplifier MMICs for millimeter-wave chip scale packaging," IEEE, 2016, pp. 1-4.

Kazior et al., "DBIT—Direct Backside Interconnect Technology: A manufacturable, bond wire free interconnect technology for microwave and millimeter wave MMICs," IEEE MTT-S Digest, 1997, pp. 723-726.

Lin et al., "6 inch 0.1 um GaAs pHEMT technology for ENI band application," CS Mantech Conference, May 16-19, 2011, Palm Springs, CA, pp. 1-3.

Lin et al., "Development of an ultra-wideband suspended stripline to shielded microstrip transition,." IEEE Microwave and Wireless Components Letters, Sep. 2011, vol. 21, No. 9. pp. 474-476.

Schmückle et al., "40 GHz hot-via flip-chip interconnects," IEEE MTT-S Digest, 2003, pp. 1167-1170.

Stratix 10 Devices, High Speed Signal Interface Layout Design Guideline, Intel, pp. 1-88, Nov. 11, 2016.

Zhou et al., "3D heterogeneous integration technology using hot via MMIC and silicon interposer with millimeter wave application," IEEE, 2017, pp. 499-502.

(56) References Cited

OTHER PUBLICATIONS

Extended European Search Report issued in application No. 19176598.1, dated Oct. 4, 2019.
International Search Report and Written Opinion in application No. PCT/US2022/082212, dated May 8, 2023, in 9 pages.

* cited by examiner

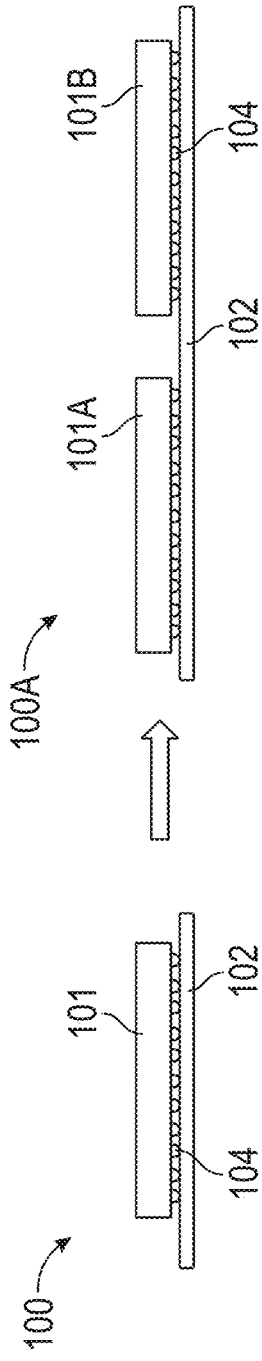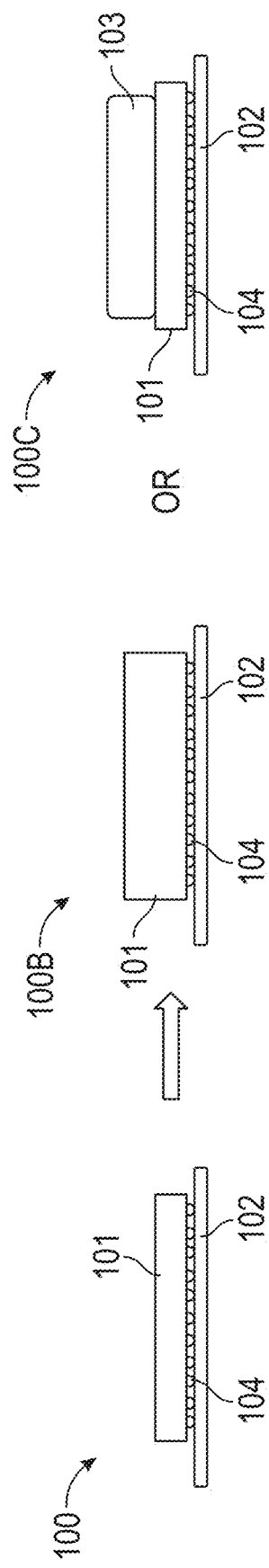

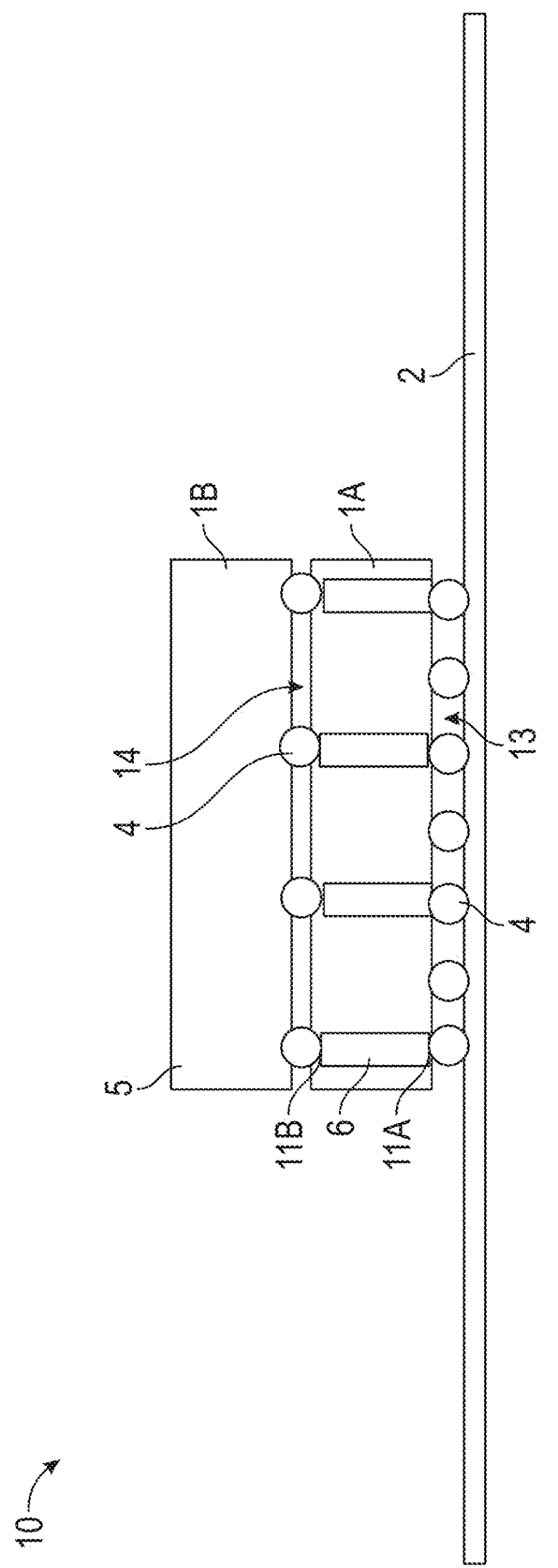

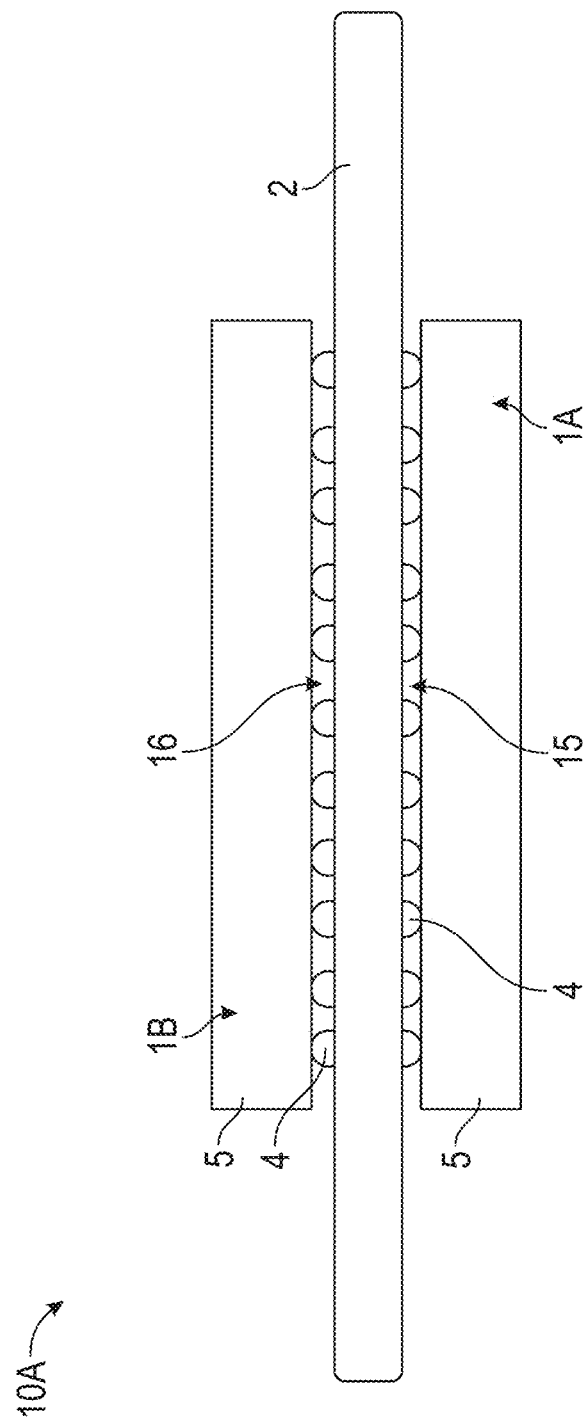

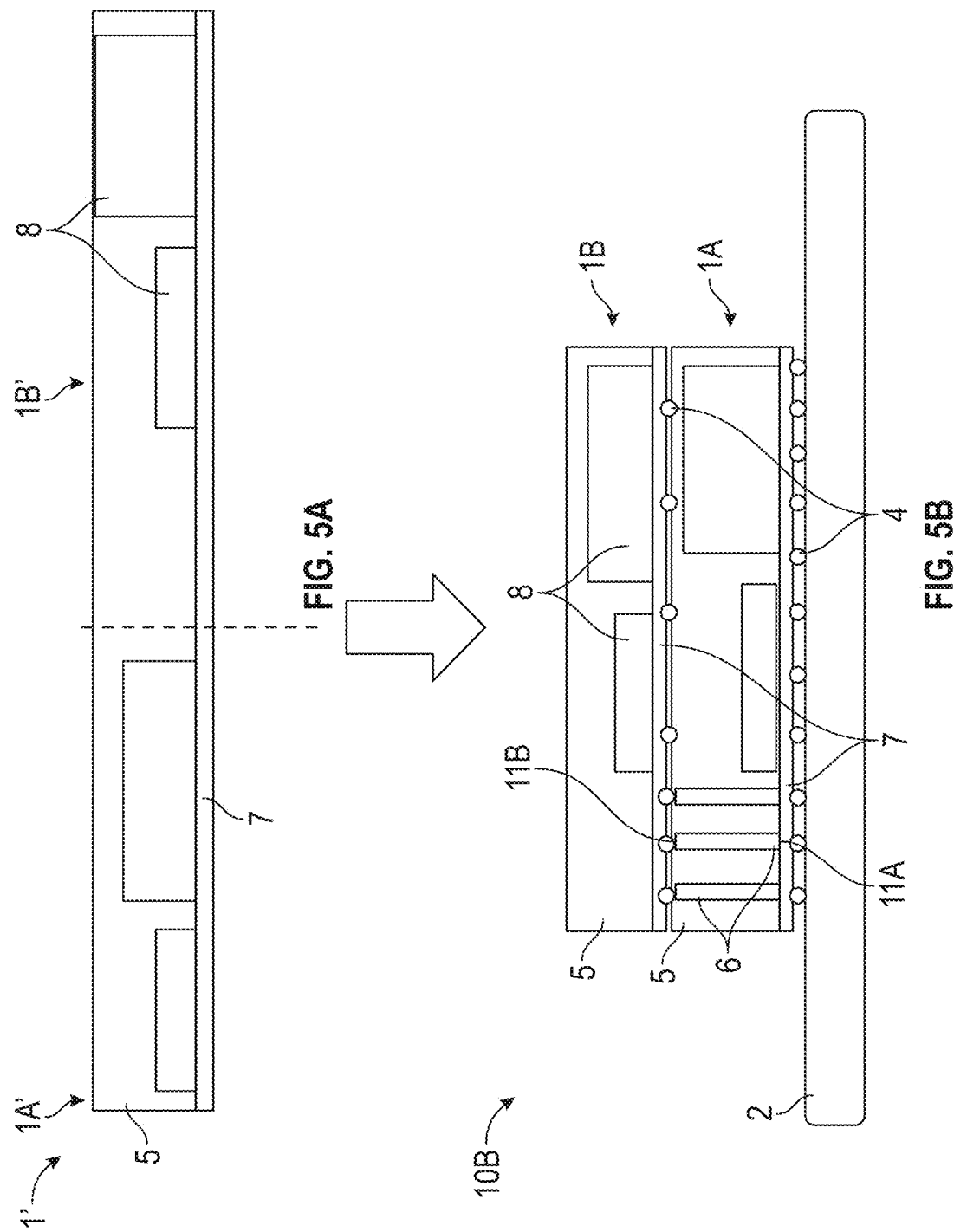

ELECTRONIC ASSEMBLY

BACKGROUND

Field of the Invention

The field relates to an electronic assembly and, in particular, to an assembly including a plurality of electronic device packages stacked on one another.

Description of the Related Art

Various electronic devices (e.g., high power regulators), in order to achieve higher power and output performance, utilize a greater footprint on a substrate, for example, placing parts side-by-side. However, providing multiple devices side-by-side increases the lateral footprint of the system board. Accordingly, there is a continuing need for improved electronic assemblies.

SUMMARY

In one embodiment, an electronic assembly can include: a first electronic device package configured to be mounted on and electrically connected with a system substrate; a second electronic device package electrically connected to the system substrate; and an electrical pathway configured to extend from the system substrate through the first electronic device package and connected to an input terminal of the second electronic device package, the electrical pathway bypassing processing circuitry of the first electronic device package.

In some embodiments, the first electronic device package comprises a first electronic component and a first molding compound in which the first electronic component is at least partially embedded. In some embodiments the second electronic device package is stacked on the first electronic device package. In some embodiments, the first electronic device package includes a first plurality of electrical contacts on a first side of the first electronic device package and a second plurality of electrical contacts on a second side of the first electronic device package that is opposite the first side, the second electrical device package electrically mounted on the second side of the first electronic device package and electrically connected to the second plurality of electrical contacts by way of a plurality of electrical interconnects. In some embodiments, the second plurality of electrical contacts are disposed in a plurality of divots recessed in the first molding compound. In some embodiments, the second plurality of electrical contacts includes fewer electrically active electrical contacts than the first plurality of electrical contacts. In some embodiments, the first electronic device package comprises a first vertical interconnect extending through the first molding compound, the first vertical interconnect to electrically connect the system substrate with the second electronic device package. In some embodiments, the first electronic device package comprises a first package substrate, the first vertical interconnect connected to the first package substrate, the first package substrate electrically connected to the system board by way of one or more electrical interconnects. In some embodiments, the second electronic device package comprises a second electronic component and a second molding compound in which the second electronic device is at least partially embedded. In some embodiments, the first electronic device package is mounted on a first surface of the system substrate, and wherein the second electronic device package is mounted on a second surface of the system substrate that is opposite the first surface. In some embodiments, the first electronic device package includes a first voltage regulator and the second electronic device package includes a second voltage regulator, the second electronic device package having a first input port at a first voltage, a first output port at a second voltage, the first electronic device package having a second input port connected to the first output port and a second output port configured to output a third voltage. In some embodiments, at least one of the first and second electronic device packages further includes a ground port connected to electrical ground. In some embodiments, the second voltage is greater than the third voltage, and wherein the first voltage is greater than the second voltage. In some embodiments, the electronic assembly can include a first via at least partially through the first electronic device package to connect the system substrate to the first input port of the second electronic device package and a second via at least partially through the first electronic device package to connect the first output port to the second input port. In some embodiments, the first electronic device package comprises a digital power system management package and the second electronic device package comprises a voltage regulator. In some embodiments, the second electronic device package is configured to electrically connect to the system substrate in electrical parallel with the first electronic device package. In some embodiments, the second electronic device package is configured to electrically connect to the system substrate in series with the first electronic device package.

In another embodiment, an electronic assembly can include: a first electronic device package configured to be mounted on and electrically connected to a system substrate, a first via extending at least partially through the first electronic device package; and a second electronic device package mounted on the first electronic device package and configured to be electrically connected to the system substrate at least through the first via.

In some embodiments, the first via bypasses processing circuitry in the first electronic device package. In some embodiments, the first electronic device package comprises a first electronic component mounted to a first package substrate and a first molding compound in which the first electronic component is at least partially embedded, the first via extending through the first molding compound. In some embodiments, the first electronic device package includes a first voltage regulator and the second electronic device package includes a second voltage regulator, the second electronic device package having a first input port at a first voltage, a first output port at a second voltage, the first electronic device package having a second input port connected to the first output port and a second output port configured to output a third voltage, wherein the second voltage is greater than the third voltage, and wherein the first voltage is greater than the second voltage.

In another embodiment, a method of manufacturing an electronic assembly is disclosed. The method can include: mounting and electrically connecting a first electronic device package to a system substrate; mounting a second electronic device package electrically to the first electronic device package; and providing an electrical pathway from the system substrate through the first electronic device package and connecting to an input terminal of the second electronic device package, the electrical pathway bypassing processing circuitry of the first electronic device package.

In some embodiments, the method can include mounting a first electronic component to a first package substrate and at least partially embedding the first electronic component in a first molding compound, the electrical pathway including a first via extending through the first molding compound.

In another embodiment, a method of manufacturing an electronic assembly can include: mounting and electrically connecting a first electronic device package to a system substrate; and electrically connecting a second electronic device package to the system substrate in parallel with the first electronic device package.

In some embodiments, the method can include mounting the second electronic device package to the first electronic device package, wherein electrically connecting the second electronic device package to the system substrate comprises providing a via through the first electronic device package to electrically connect the second electronic device package and the system substrate. In some embodiments, the method can include mounting the second electronic device package to a side of the system substrate opposite to the first electronic device package.

BRIEF DESCRIPTION OF THE DRAWINGS

Embodiments of this disclosure will now be described, by way of non-limiting example, with reference to the accompanying drawings.

FIG. 1A is a schematic side view of an electronic assembly that incorporates multiple electronic device packages mounted side-by-side on a system substrate.

FIG. 1B is a schematic side view of electronic assembly that includes taller components to accommodate higher electrical power.

FIG. 2 is a schematic side sectional view of an electronic assembly, according to various embodiments.

FIG. 4 is a schematic side sectional view of an electronic assembly, according to various embodiments.

FIG. 5A is a schematic side sectional view of a molded packaging assembly in a multistage arrangement.

FIG. 5B is a schematic side sectional view of an electronic assembly according to various embodiments.

DETAILED DESCRIPTION

Figure 3B:
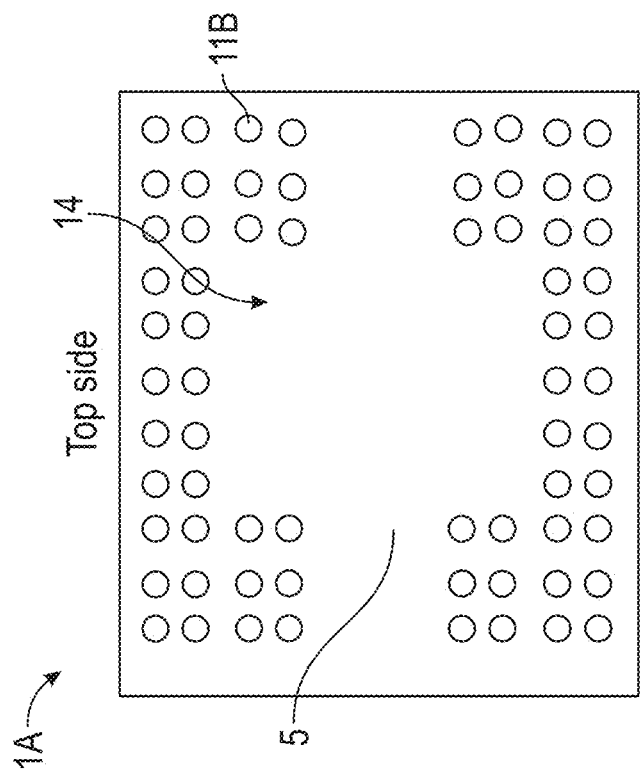
FIG. 3B is a top plan view of an electronic device package having a second plurality of contacts on a top side of the package.

Electronic assemblies include devices that generate a significant amount of power. The generated power can result in a high level of heat which can be dissipated in a variety of ways. Moreover, it is important to provide the electronic assembly with a footprint (e.g., on a substrate) that is compact. FIG. 1A is a schematic side view of a conventional electronic assembly 100 in which an electronic device package 101 is mounted to a system substrate 102 by way of a plurality of electrical interconnects 104 (e.g., solder balls). In various examples, the electronic device package 101 can comprise a voltage regulator. For high power applications, additional circuitry and components may be used in order to increase the output current. In FIG. 1A, increased power (and current) output can be provided by providing multiple (e.g., two or more) electronic device packages side-by-side on a system substrate 102 in an electronic assembly 100A. However, the use of multiple packages side-by-side on the substrate 102 increases the footprint of the assembly 100A, which takes up valuable board space.

FIG. 1B is a schematic side view of electronic assembly 100B, 100C that includes taller components to accommodate higher electrical power. Unlike FIG. 1A, in order to provide increased power (and output current), the additional circuitry and other components may be provided by way of taller components in a package 100B. In some arrangements, increased power can be accommodated by mounting a component 103 (such as an inductor) on the package 101. However, the use of taller components or packages can increase the heat flux in the assemblies 100B, 100C, which may create challenging thermal management issues. Further, although taller components may increase output current and power, if additional output current is desired, then additional parts would be included side-by-side, increasing the lateral footprint of the device.

Accordingly, there remains a continuing need for compact electronic assemblies that facilitate high power and/or high current applications without creating excessive heat flux. FIG. 2 is a schematic side sectional view of an electronic assembly 10, according to various embodiments. The electronic assembly 10 (which can include packages 1A, 1B) can be mounted to a system substrate 2. The system substrate 2 can serve as a system board (e.g., motherboard) and can comprise any suitable type of substrate. For example, in the illustrated embodiment, the system substrate 2 can include a laminate substrate, such as a printed circuit board (PCB).

The electrical assembly 10 can include a first electronic device package 1A mounted on and electrically connected with the system substrate 2. As explained herein in FIGS. 5A-5B, the first electronic device package 1A can comprise one or a plurality of electronic devices 8 mounted to a package substrate 7. The electronic device(s) 8 can comprise active integrated device die(s) (e.g., die(s) with one or more transistors) or passive components, such as capacitors, inductors, transformers, etc. The electronic device(s) 8 can be at least partially embedded in a molding compound 5, which can comprise an organic protective coating, such as an epoxy. As shown in FIG. 2, the first electronic device package 1A can comprise one or a plurality of vertical interconnects (e.g., vias 6) that extend at least partially through the package 1A. In the illustrated embodiment, the vias 6 comprise through mold vias (TMVs) that extend through the molding compound 5. As explained herein in FIGS. 5A-5B, in some embodiments, the vias 6 can be connected to the package substrate 7, which can electrically connect to the interconnects 4 (e.g., solder balls).

The electronic assembly 10 can comprise a second electronic device package 1B electrically connected to the system substrate 2 in parallel (or in series) with the first electronic device package 1A. The second electronic device package 1B can comprise at least a second electronic device 8 (e.g., integrated device die(s), passive component(s), etc.) and a second molding compound 5 in which the second electronic device 8 is at least partially embedded. In some embodiments, the first and second electronic device packages 1A, 1B can comprise the same type of device package (and, for example, in some embodiments, may comprise substantially similar or identical packages). In other embodiments, the first and second electronic device packages 1A, 1B can comprise different types of packages. As shown in the embodiment of FIG. 2, the second electronic device package 1B can be stacked on and electrically connected to the first electronic device package 1A. The first electronic device package 1A can include a first plurality of electrical contacts 11A on a first bottom side 13 of the first electronic device package 1A and a second plurality of electrical contacts 11B on a second top side 14 of the first electronic device package 1A that is opposite the first side 13. The first plurality of electrical contacts 11A on the first bottom side 13 of the first electronic device package 1A can be electrically connected to the system board 2 by way of a first plurality of electrical interconnects 4 (e.g., solder balls). The second electronic device package 1B can be electrically mounted on the second top side 14 of the first electronic device package 1A and electrically connected to the second plurality of electrical contacts 11B by way of a second plurality of electrical interconnects 4 (e.g., solder balls). In various embodiments, the packages 1A, 1B can be electrically connected using a ball grid array (BGA), a linear grid array (LGA), or any other suitable type of electrical connection arrangement.

In the embodiment of FIG. 2, the second electronic device package 1B can be connected to the system substrate 2 in electrical parallel with the first electronic device package 1A. For example, the vias 6 can electrically connect to the system board 2 by way of the interconnects 4 (and, as shown in FIG. 5B, by way of a package substrate 7) and can serve as pass-through vias such that electrical power and/or signals bypass the first electronic device package 1A and electrically connect to component(s) of the second device package 1B (e.g., by way of a package substrate 7 in the second package 1B). Thus, in various embodiments, an electrical pathway can be provided from the system substrate 2 through the first electronic device package 1A and connected to an input terminal of the second electronic device package 1B. The electrical pathway can bypass processing circuitry of the first electronic device package 1A in some embodiments. For example, the electrical pathway can bypass processing circuitry (e.g., all processing circuitry in some embodiments) patterned or formed in one or more dies of the first package 1A.

Beneficially, due to the parallel connection of the second electronic device package 1B, the upper second package 1B can utilize fewer pins or connections than the lower first package 1A. As shown in FIG. 2, the second plurality of electrical contacts 11B (which provide electrical communication with the upper second package 1B) can include fewer electrically active electrical contacts 11 than the first plurality of electrical contacts 11A (which electrically communicates with the system substrate 2). Accordingly, in some embodiments, the first electronic device package 1A can process or operate with a larger number of inputs (e.g., through the larger first plurality of electrical contacts 11A) from the system substrate 2, and, in some embodiments, can serve as a control package for the assembly 10. The second electronic device package 1B can serve as a responder package, which can respond to control inputs from the system substrate 2 (by way of the vias 6) and/or from the first package 1A. As explained herein, providing the parallel electrical pathways can enable power sharing between the packages 1A, 1B, reduce the physical footprint of the assembly 10, and increases the power density for the assembly footprint.

In addition, the embodiment of FIG. 2 can also beneficially allow for increases in output current and/or increases in input voltage. The use of stacked packages can save board space and reduce the footprint as compared to other packages. The thermal performance can also be improved by splitting the current amongst multiple packages in parallel, which can allow for increased current usage without significantly increasing power loss and, accordingly, without significantly increasing temperature. The use of different types of packages in the disclosed embodiments can also enable versatile electronic assembly designs.

Figure 3A:
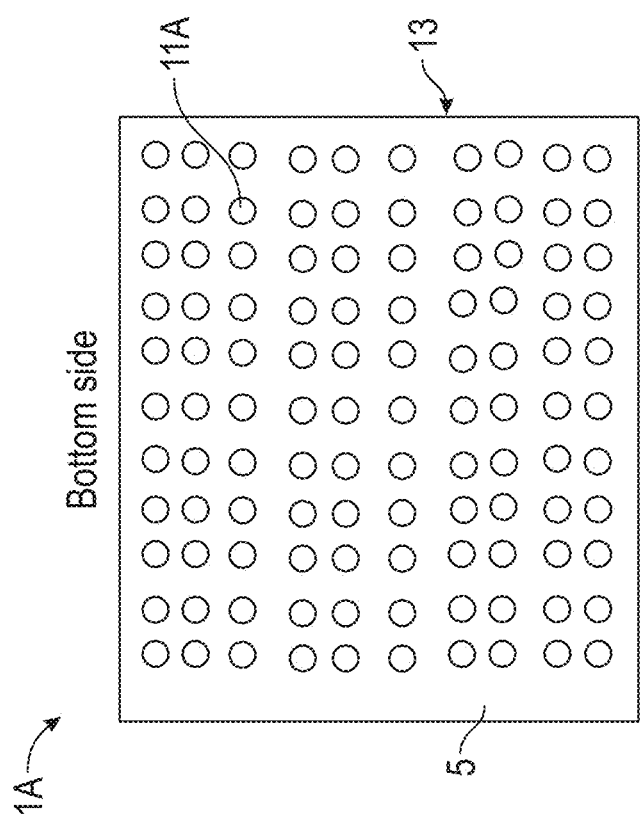
FIG. 3A is a bottom plan view of an electronic device package having a first plurality of contacts on a bottom side of the package.

FIG. 3A is a bottom plan view of the first electronic device package 1A having a first plurality of contacts 11A on the first bottom side 13 of the package 1A. FIG. 3B is a top plan view of the first electronic device package 1A having a second plurality of contacts 11B on a second top side 14 of the package 1A. As explained above, at least due to the parallel connection to the system substrate 2 between the first and second packages 1A, 1B, the second plurality of contacts 11B on the top side 14 can include fewer electrically active contacts than the first plurality of contacts 11A on the bottom side 13. In other embodiments, however, additional contacts 11B or pins can be provided for ground and I/O connections, and/or to provide a thermal path for the upper package 1B to dissipate heat through the bottom package 1A. For example, providing additional pins or contacts 11B on the top side 14 of the lower package 1A may improve heat removal for the upper package 1B. The additional pins or contacts 11B for heat dissipation may be electrically inactive or disconnected, however, such that the top side 14 still includes fewer active electrical contacts 11B on the top side 14 than the first plurality of contacts 11A on the bottom side 13.

Figure 3D:
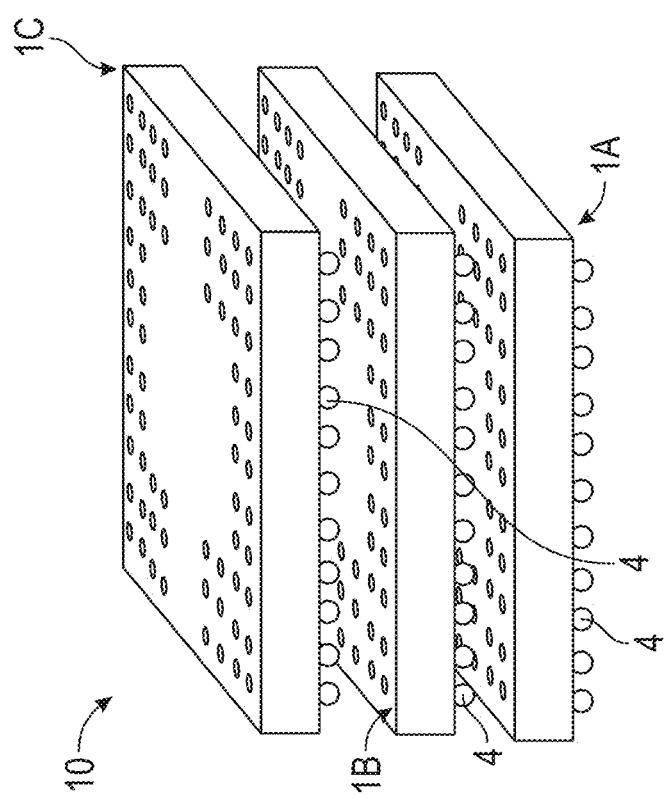
FIG. 3D is a schematic perspective view of an electronic assembly comprising three stacked electronic device packages.
Figure 3C:
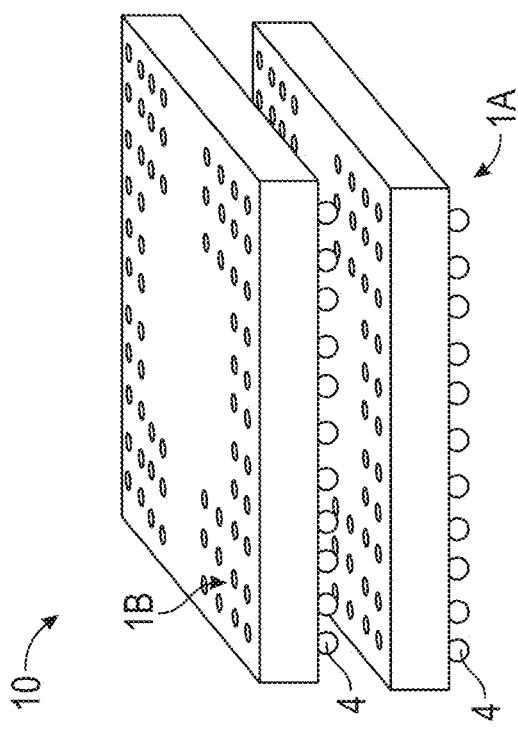
FIG. 3C is a schematic perspective view of an electronic assembly comprising two stacked electronic device packages.

FIG. 3C is a schematic perspective view of an electronic assembly 10 comprising two stacked electronic device packages 1A, 1B. FIG. 3D is a schematic perspective view of an electronic assembly 10 comprising three stacked electronic device packages 1A, 1B, 1C. It should be appreciated that any suitable number of packages 1A-1C can be stacked on top of one another. In the illustrated embodiments, the first package 1A can comprise the controller package, and the second and third packages 1B, 1C can comprise responder packages controlled by another component through the system board 2 (e.g., a substrate) and/or by the first package 1A. In other embodiments, the stacked packages 1A-1C can be digitally controlled or preprogrammed, and can share the output current (at the same voltage). A user can use a computer connected to the board 2 to turn any of the components (e.g., components in the packages 1A-1C) on or off individually. In some embodiments, the second package 1B can connect to the third package 1C by way of electrical contacts having the same number of contacts as the second plurality of contacts 11B. Thus, in some embodiments, the second and third packages 1B, 1C can have fewer pins (e.g., fewer inputs or contacts) than the first package 1A. The third package 11C can connect to the system substrate 2 in parallel with both the first and second packages 11A, 11B. For example, TMVs 6 can extend through the first package 1A and the second package 11B to serve as pass through vias to connect the third package 1C to the system board 2 while bypassing the first and second packages 1A, 1B. Although three packages 1A-1C are shown in FIG. 3D, in other embodiments, more than three packages can be provided in the assembly 10.

FIG. 4 is a schematic side sectional view of an electronic assembly 10A, according to various embodiments. Unless otherwise noted, the components of FIG. 4 may be the same as or generally similar to like-numbered components of FIGS. 2-3D. As with the embodiments of FIGS. 2-3D, the first and second packages 1A, 1B are in electrical communication in parallel with the system board 2. Unlike the embodiments of FIGS. 2 and 3C-3D, in FIG. 4, the first electronic device package 1A is mounted on a first surface 15 of the system substrate 2, and the second electronic device package 1B is mounted on a second surface 16 of the system substrate 2 that is opposite the first surface 15. Conductive traces (not shown) within the system substrate 2 can electrically route signals between the packages 1A, 1B, instead of utilizing the vias 6 to connect to the package 1B.

FIG. 5A is a schematic side sectional view of a molded packaging assembly 1' in a multistage arrangement. In the arrangement of FIG. 5A, a first stage 1A' can provide a first voltage regulation, e.g., a downregulation of 100 V to 12 V in a first stage. The stepped down voltage from the first stage 1A' can be conveyed to a second stage 1B'. The second stage 1B' can provide a second voltage regulation, e.g., a further downregulation of 12V to 1 V. Thus, the arrangement of FIG. 5A includes a plurality (e.g., two) of stages that are horizontally spaced from one another, which can increase the lateral footprint of the assembly 1'.

By contrast, FIG. 5B is a schematic side sectional view of an electronic assembly 10B including stacked packages 1A, 1B according to various embodiments. The electronic assembly 10B and/or the packages 1A, 1B can be used in combination with any of the embodiments disclosed herein. As shown in FIG. 5A, a package substrate 7 can be provided. The package substrate 7 can comprise any suitable type of packaging substrate, such as a laminate substrate (e.g., a PCB), a ceramic substrate, a leadframe, etc. One or more components or devices 8 can be mounted and electrically connected to the package substrate 7. The one or more components 8 can comprise one or more of an integrated device die (e.g., an active chip with one or more transistors), a passive electronic device (e.g., a resistor, inductor, transformer, capacitor, etc.). The component(s) 8 can be flip chip mounted to the package substrate 7 in some embodiments. In other embodiments, the component(s) or devices 8 can be mounted and wire bonded to the package substrate 7. Vias 6 (e.g., TMVs) can be connected to the package substrate 7. For example, in some embodiments, the vias 6 can be picked-and-placed onto the substrate 7 and attached with a conductive adhesive (e.g., solder). The component(s) 8 and vias 6 can be overmolded with molding compound 5.

In FIG. 5B, the first package 1A can be mounted on and electrically connected to the system substrate 2. For example, the first plurality of electrical contacts 11A (which can be coupled to a bottom side of the package substrate 7) can be connected to corresponding contacts or pads on the system substrate 2 by way of interconnects, e.g., solder balls or bumps. The second package 1B can be stacked on the first package 1A. The second plurality of contacts 11B (which can include fewer contacts than the first plurality of contacts 11A, as explained above and shown herein) can be connected to corresponding contacts or pads on the package substrate 7 of the second package 1B by way of interconnects 4. As shown, the vias 6 can serve as pass-through TMVs that electrically bypass the first package 1A such that the second package 1B connects to the system substrate 2 (by way of, e.g., the package substrate 7 of the first package 1A) in series with the first package 1A. In some embodiments, as noted above, the TMVs can connect the first and second packages 1A, 1B in parallel.

As with the arrangement of FIG. 5A, the embodiment of FIG. 5B can serve to downregulate an input voltage. For example, the first package 1A can provide a first voltage regulation, e.g., a downregulation of 100 V to 12 V in a first stage. The stepped down voltage from the first package 1A can be conveyed to the second package 1B. The second package 1B can provide a second voltage regulation, e.g., a further downregulation of 12V to 1 V. Beneficially, unlike the arrangement of FIG. 5A, in FIG. 5B, the stacked packages 1A, 1B can provide effective voltage downregulation but in a smaller lateral footprint without increasing power loss.

Figure 6B:
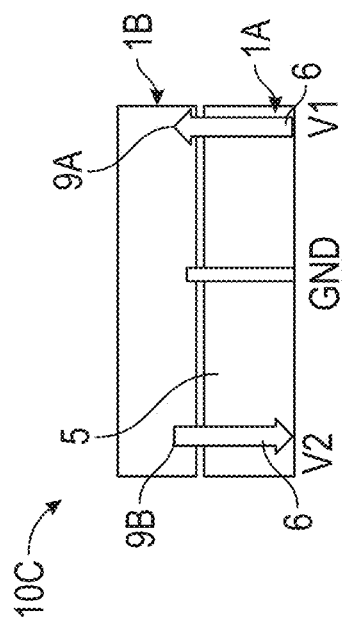
FIG. 6B is a schematic side view of the assembly of FIG. 6A.
Figure 6A:
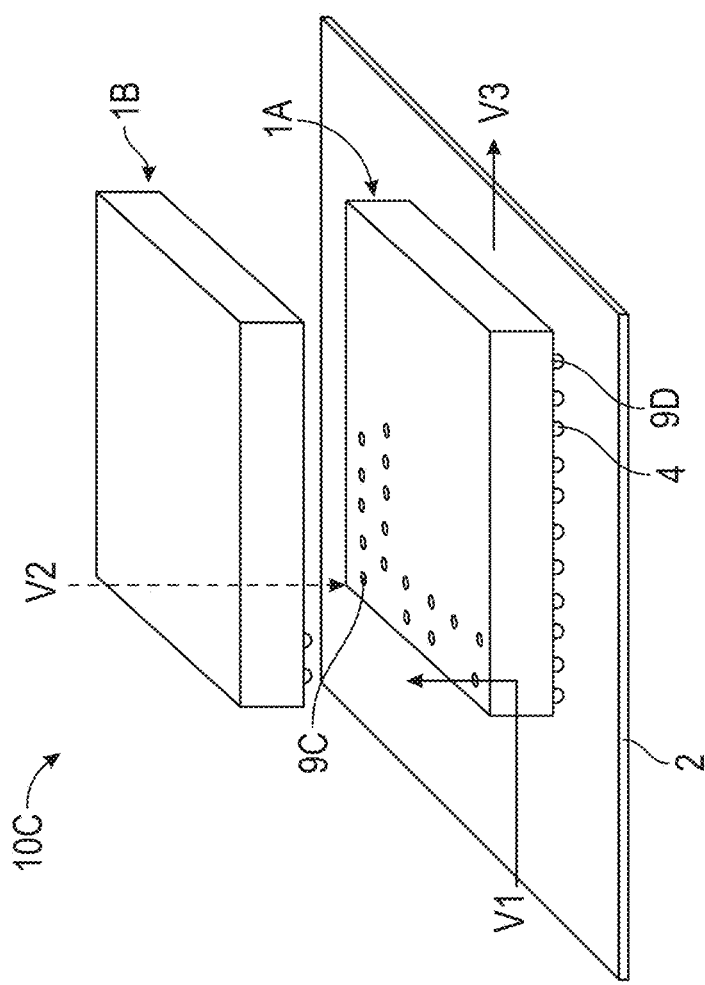
FIG. 6A is a schematic perspective view of an electronic assembly comprising first and second voltage regulators.

FIG. 6A is a schematic perspective view of an electronic assembly 10C comprising first and second voltage regulator packages 1A, 1B. FIG. 6B is a schematic side view of the assembly 10C of FIG. 6A. Unless otherwise noted, the components of FIGS. 6A-6D may include components generally similar to or the same as like-numbered components of FIGS. 2-5B. In FIGS. 6A-6B, the first and second packages 1A, 1B comprise respective voltage regulator packages. For example, as shown, the first package 1A can comprise a low voltage regulator, and the second package 1B can comprise a high voltage regulator. The second electronic device package 1B can have a first input port 9A at a first voltage V1 and a first output port 9B at a second voltage V2. The first electronic device package 1A can have a second input port 9C connected to the first output port 9B and a second output port 9D configured to output a third voltage V3. In the illustrated embodiment, the second voltage V2 is greater than the third voltage V3, and the first voltage V1 is greater than the second voltage V2. Thus, in FIG. 6A, the first input port 9A can bypass circuitry in the lower first package 1A to connect to the upper second package 1B, which an reduce the first voltage V1 to the second voltage V2. The first output port 9B can electrically connect to the second input port 9C of the lower first package 9A, which can further reduce the second voltage V2 to the lower third voltage V3, which can be provided to the substrate 2 and another electronic device by way of the second output port 9D.

Figure 6C:
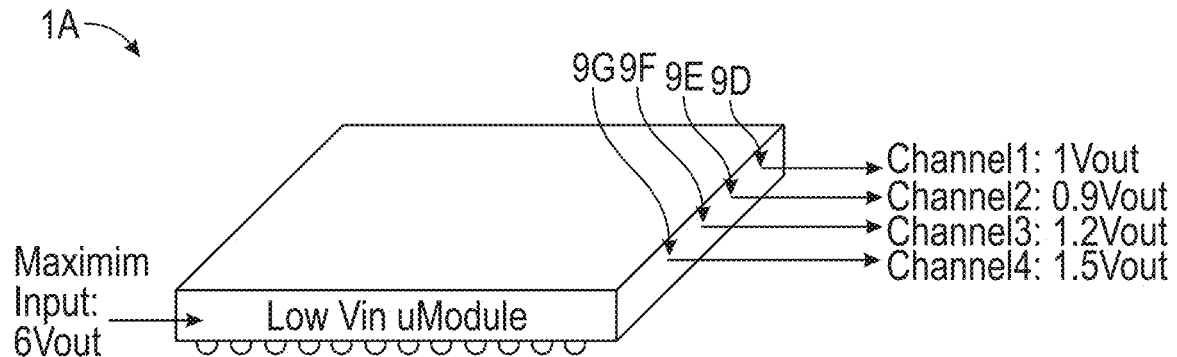
FIG. 6C is a schematic side view of assembly voltage regulator according to various embodiments.
Figure 6D:
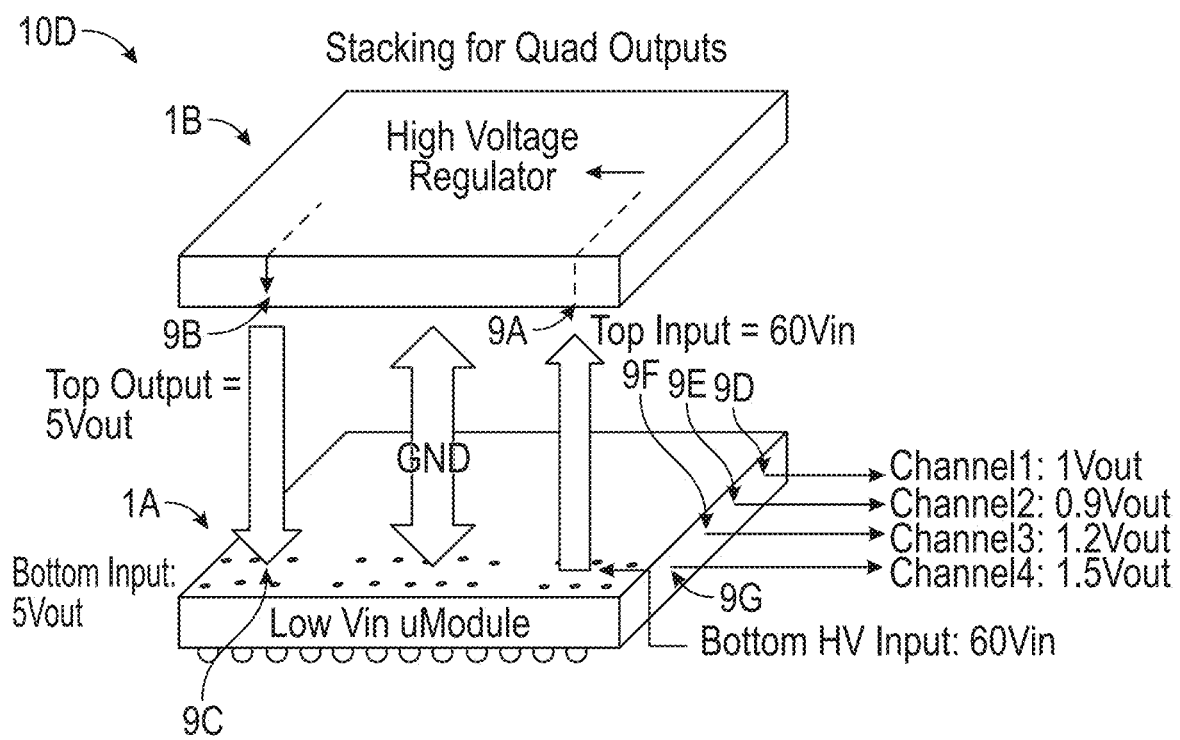
FIG. 6D is an schematic view of an electronic assembly including the voltage regulator of FIG. 6C.

FIG. 6C is a schematic side view of a the lower first package 9A which includes multiple output ports 9D, 9E, 9F, 9G (e.g., a quad channel output)e. FIG. 6D is an electrical schematic of an electronic assembly 10D that includes the quad channel output package 9A of FIG. 6C. In the conventional regulator 100D shown in FIG. 6C, the regulator 100D accepts a low voltage input (e.g., 6 Vin) and outputs a quad channel output, e.g., in which multiple (e.g., four) voltage outputs 9D-9G are provided from the lower first package 1A. Thus, the lower first package 1A can be limited to relatively low voltage inputs, for example 5V in one application, while the upper second package 1B can accept larger voltages (e.g., 60V in one application). Beneficially, in the embodiment of FIGS. 6C-6D, the first input port 9A of the second package 1B can connect to the system substrate 2 and can bypass the first package 1A by way of a first TMV 6 (see FIGS. 5B and 6B) through the molding compound 5 of the first package 1A. The first input port 9A can comprise a high voltage (HV) input (e.g., 60 V or higher). The component(s) or device(s) 8 of the second package 1B can comprise circuitry configured to reduce the voltage to a lower voltage (e.g., 5V or 6V) at the first output 9B, which can connect to the second input 9C to provide a lower voltage input to the lower first package 1A, by way of a second TMV 6 (see FIGS. 5B and 6B) through the molding compound 5 of the first package 1A. As shown in the embodiment of FIG. 6B, at least one TMV 6 can also provide a connection to ground (GND) terminal of the system substrate 2. The lower package 1B can output the lower third voltage V3 (see FIG. 6A) or a quad out channel (FIG. 6D). In the embodiment of FIG. 6D, for example, the lower package 1A can lower the voltage V2 provided to the second input terminal 9C to a plurality of lower voltages that are to output to the substrate 2 by way of multiple output channels 9D-9G. Beneficially, the embodiments of FIGS. 6A-6D can operate at higher power and a reduced package footprint.

Figure 7B:
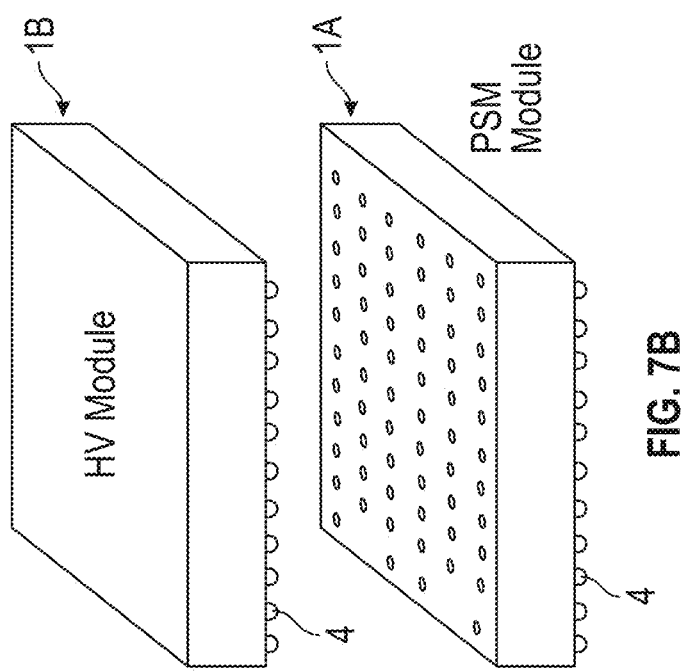
FIG. 7B is a schematic perspective view of an electronic assembly comprising a voltage regulator package stacked on a power system management (PSM) package.
Figure 7A:
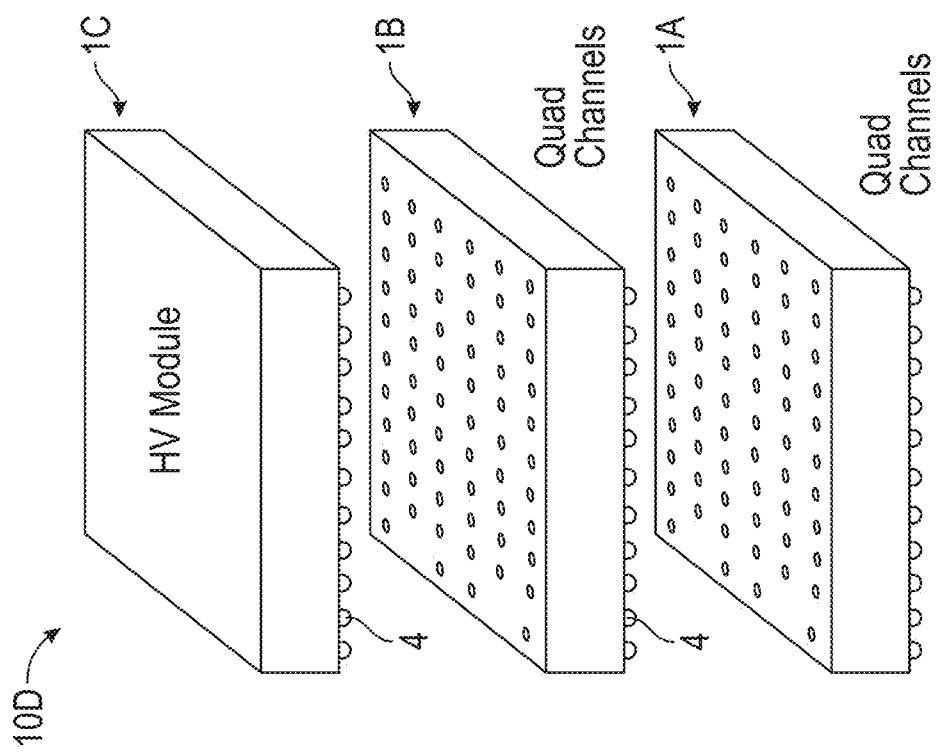
FIG. 7A is a schematic perspective view of an electronic assembly comprising three stacked electronic packages including a voltage regulator package stacked on two quad channel packages.

The embodiments disclosed herein can include assemblies in which the packages 1A, 1B are different but which are pin compatible. In other embodiments, the package 1A, 1B can be the same or similar (e.g., identical or substantially the same type of package). In some embodiments, such as those shown in FIGS. 7A-7B, the assemblies 10D, 10E can include at least two different types of packages configured for different functionalities or operations. For example, FIG. 7A is a schematic perspective view of an electronic assembly 10D comprising three stacked electronic packages 1A-1C including a voltage regulator package 1C stacked on two quad channel packages 1A. It should be appreciated that any suitable number of packages (e.g., two, three, four, five, or more than five) can be stacked on one another. FIG. 7B is a schematic perspective view of an electronic assembly comprising a voltage regulator package (e.g., a high voltage (HV) package module) stacked on a power system management (PSM) package. Skilled artisans would understand that any suitable types of packages can be used in connection with the embodiments disclosed herein.

Figure 8A:
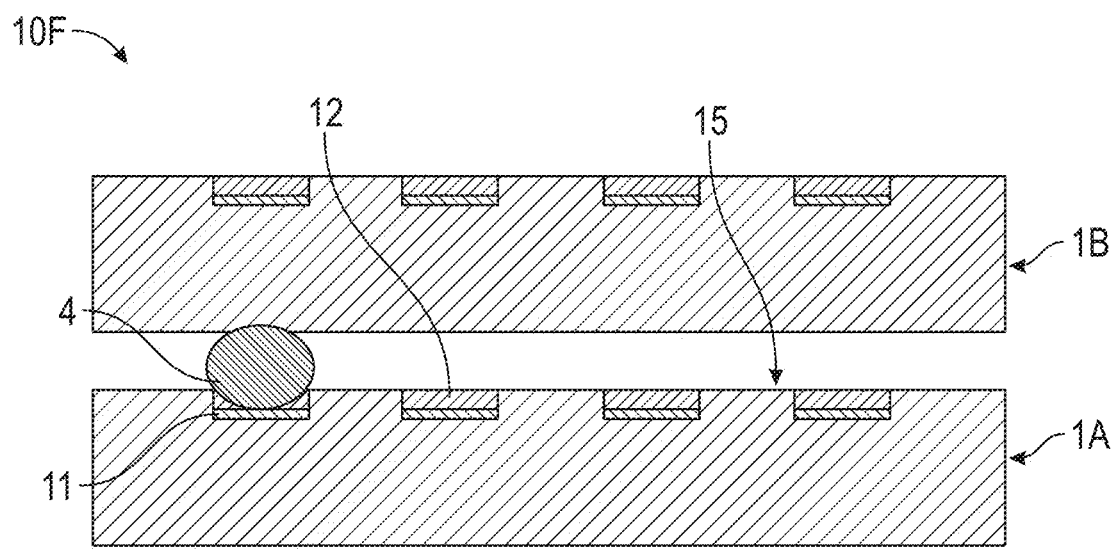
FIGS. 8A-B are schematic side sectional views of a portion of an electronic assembly including recessed electrical contacts recessed in a divot formed in a molding compound.
Figure 8B:
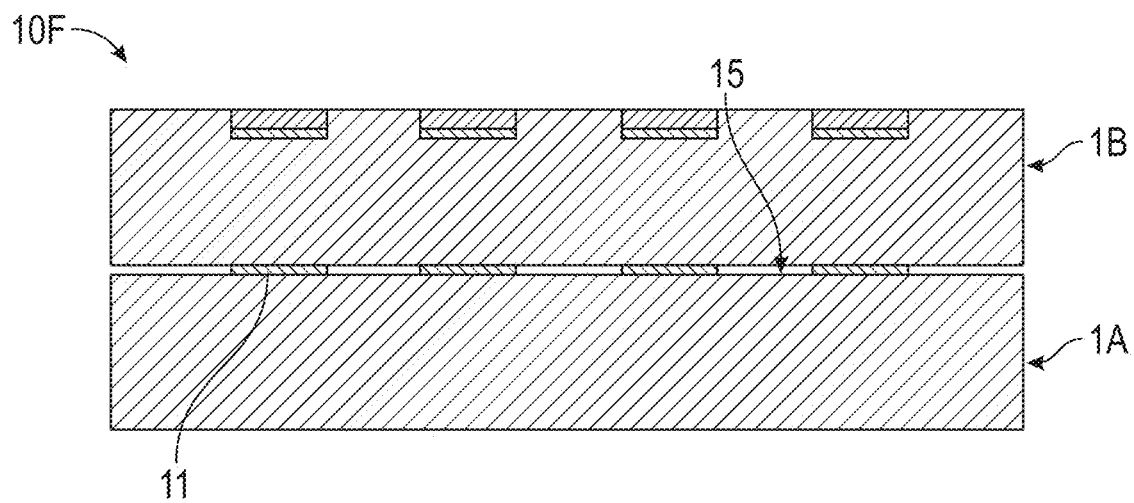

FIGS. 8A-B are schematic side sectional views of a portion of an electronic assembly 10F including recessed electrical contacts 11 recessed in a divot 12 formed in the molding compound 5. The divot 12 can be formed in any suitable manner. For example, the divot 12 can be formed by drilling, laser ablation, or a suitably-designed top mold chase. The divot 12 can serve to recess the contacts 11 below the top side 14 of the first package 1A and can help align the pins of the second package 1B to the contacts 11 of the first package 1A. The recessed divot 12 can further serve to lock the interconnects 4 in place. In addition, the divot 12 can provide electrical isolation between the contacts 11 and a heat sink if a heat sink is used over the package 1A. In other embodiments, however, the electronic assembly can utilize an LGA package for mounting and without the use of the divot 12.

Figure 9:
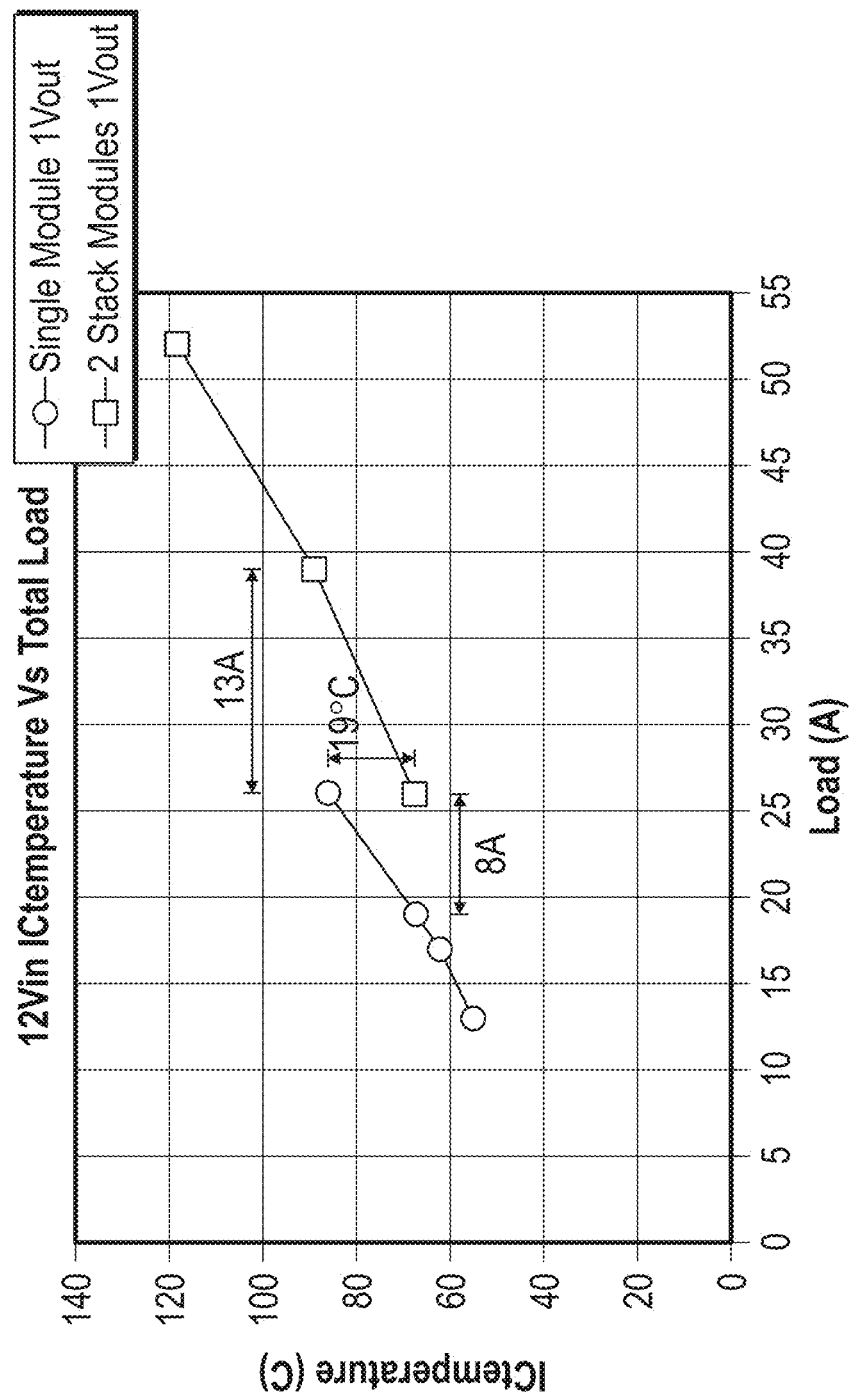
FIGS. 9-10 are charts comparing the performance of electronic assemblies disclosed herein to conventional assemblies.
Figure 10:
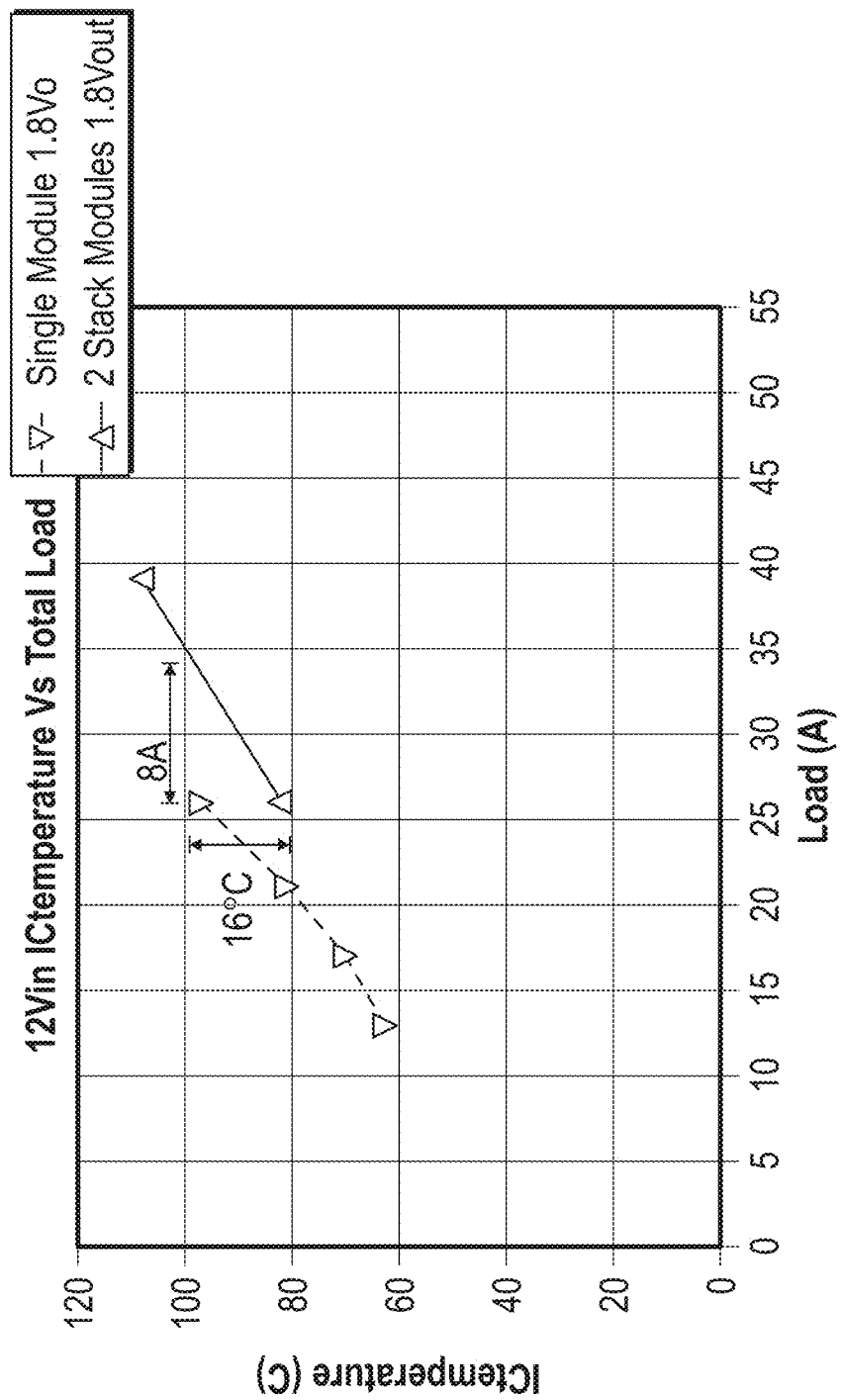

FIGS. 9-10 are charts comparing the performance of electronic assemblies disclosed herein to conventional assemblies. FIG. 9 is a chart plotting the integrated circuit (IC) temperature versus load (A) for a two-stack module 1Vout according to various embodiments disclosed herein and for a conventional module (single module 1Vout), with a 12 Vin input. FIG. 10 is a chart plotting the integrated circuit (IC) temperature versus load (A) for a two-stack module 1.8 Vout according to various embodiments disclosed herein and for a conventional module (single module 1.8 Vout), with a 12 Vin input. As shown in FIGS. 9 and 10, the two-stack module (for either 1 Vout or 1.8 Vout) can utilize substantially larger currents without significantly increasing the temperature.

When it comes to power solutions, customers look for the optimal performance in a small footprint. If existing parts are incapable to meeting the output requirements, multiple parts can be put side by side (current sharing) to meet the requirement. By compromising footprint criteria, output performance can be improved. The embodiments disclosed herein reduce lateral footprint by stacking multiple packages or modules together.

The disclosed embodiments of stacking packages or uModules takes advantage of the under-utilized vertical space above the assembly to achieve an improve in output performance without increasing the footprint. To do this, the assembly utilizes pins on both the bottom side and top side as well to enable paralleling. Stacking multiple packages can increase output current up to 50% while maintaining the same thermal performance. This idea is based on the fact that conduction loss ($P=I^2\times R$) is exponentially dependent on the current. Depending on the output configuration, stacking multiple packages can enable 100% increase capability in output current (compare to one package). Stacking multiple packages allows customers to upgrade the assembly without a major board design layout change. The ability for a quick upgrade is advantageous. In order to bring the pins up from the substrate to the top side of a package, as explained here, copper pillars or other packaging technology can be utilized.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. Regarding the word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

Although disclosed in the context of certain embodiments and examples, it will be understood by those skilled in the art that the present invention extends beyond the specifically disclosed embodiments to other alternative embodiments and/or uses and obvious modifications and equivalents thereof. Further, unless otherwise noted, the components of an illustration may be the same as or generally similar to like-numbered components of one or more different illustrations. In addition, while several variations have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the aspects that follow.

What is claimed is:

1. An electronic assembly comprising:
a first electronic device package configured to be mounted on and electrically connected with a system substrate;
a second electronic device package electrically connected to the system substrate; and
an electrical pathway configured to extend from the system substrate through the first electronic device package and connected to an input terminal of the second electronic device package, the electrical pathway bypassing processing circuitry of the first electronic device package, wherein the first electronic device package comprises a first electronic component and a first molding compound in which the first electronic component is at least partially embedded, wherein the second electronic device package is stacked on the first electronic device package, and wherein the first electronic device package comprises a first vertical interconnect extending through the first molding compound, the first vertical interconnect to electrically connect the system substrate with the second electronic device package.

2. The electronic assembly of claim 1, wherein the first electronic device package includes a first plurality of electrical contacts on a first side of the first electronic device package and a second plurality of electrical contacts on a second side of the first electronic device package that is opposite the first side, the second electrical device package electrically mounted on the second side of the first electronic device package and electrically connected to the second plurality of electrical contacts by way of a plurality of electrical interconnects.

3. The electronic assembly of claim 2, wherein the second plurality of electrical contacts are disposed in a plurality of divots recessed in the first molding compound.

4. The electronic assembly of claim 2, wherein the second plurality of electrical contacts includes fewer electrically active electrical contacts than the first plurality of electrical contacts.

5. The electronic assembly of claim 1, wherein the first electronic device package comprises a first package substrate, the first vertical interconnect connected to the first package substrate, the first package substrate electrically connected to the system board by way of one or more electrical interconnects.

6. The electronic assembly of claim 1, wherein the second electronic device package comprises a second electronic component and a second molding compound in which the second electronic device is at least partially embedded.

7. The electronic assembly of claim 1, wherein the first electronic device package is mounted on a first surface of the system substrate, and wherein the second electronic device package is mounted on a second surface of the system substrate that is opposite the first surface.

8. The electronic assembly of claim 1, wherein the first electronic device package includes a first voltage regulator and the second electronic device package includes a second voltage regulator, the second electronic device package having a first input port at a first voltage, a first output port at a second voltage, the first electronic device package having a second input port connected to the first output port and a second output port configured to output a third voltage.

9. The electronic assembly of claim 8, wherein at least one of the first and second electronic device packages further includes a ground port connected to electrical ground.

10. The electronic assembly of claim 8, wherein the second voltage is greater than the third voltage, and wherein the first voltage is greater than the second voltage.

11. The electronic assembly of claim 8, further comprising a first via at least partially through the first electronic device package to connect the system substrate to the first input port of the second electronic device package and a second via at least partially through the first electronic device package to connect the first output port to the second input port.

12. The electronic assembly of claim 1, wherein the first electronic device package comprises a digital power system management package and the second electronic device package comprises a voltage regulator.

13. The electronic assembly of claim 1, wherein the second electronic device package is configured to electrically connect to the system substrate in electrical parallel with the first electronic device package.

14. The electronic assembly of claim 1, wherein the second electronic device package is configured to electrically connect to the system substrate in series with the first electronic device package.

15. An electronic assembly comprising:
a first electronic device package configured to be mounted on and electrically connected to a system substrate, a first via extending at least partially through the first electronic device package; and
a second electronic device package mounted on the first electronic device package and configured to be electrically connected to the system substrate at least through the first via, wherein the first via bypasses processing circuitry in the first electronic device package, and wherein the first electronic device package comprises a first electronic component mounted to a first package substrate and a first molding compound in which the first electronic component is at least partially embedded, the first via extending through the first molding compound.

16. The electronic assembly of claim 15, wherein the first electronic device package includes a first voltage regulator and the second electronic device package includes a second voltage regulator, the second electronic device package having a first input port at a first voltage, a first output port at a second voltage, the first electronic device package having a second input port connected to the first output port and a second output port configured to output a third voltage, wherein the second voltage is greater than the third voltage, and wherein the first voltage is greater than the second voltage.

17. A method of manufacturing an electronic assembly, the method comprising:
   mounting and electrically connecting a first electronic device package to a system substrate;
   mounting a second electronic device package electrically to the first electronic device package; and providing an electrical pathway from the system substrate through the first electronic device package and connecting to an input terminal of the second electronic device package, the electrical pathway bypassing processing circuitry of the first electronic device package;
   mounting a first electronic component to a first package substrate and at least partially embedding the first electronic component in a first molding compound, the electrical pathway including a first via extending through the first molding compound.

* * * * *